(12) United States Patent
Otremba (10) Patent No.: US 8,098,499 B2
(45) Date of Patent: Jan. 17, 2012

(54) CIRCUIT ARRANGEMENT HAVING TWO SEMICONDUCTOR SWITCHING ELEMENTS AND ONE FREEWHEELING ELEMENT

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 931 days.

(21) Appl. No.: 12/112,412

(22) Filed: Apr. 30, 2008

(65) Prior Publication Data

US 2009/0273913 A1 Nov. 5, 2009

(51) Int. Cl.
*H05K 7/00* (2006.01)
(52) U.S. Cl. ........................................................ 361/820
(58) Field of Classification Search .................. 361/820, 361/783, 752–753, 715, 723, 796; 257/710–713, 257/720, 722–724, 796
See application file for complete search history.

(56) References Cited

U.S. PATENT DOCUMENTS

| | | | |
|---|---|---|---|
| 7,545,653 B2 * | 6/2009 | Itagaki | 361/820 |
| 2002/0181255 A1 * | 12/2002 | Flock et al. | 363/41 |
| 2011/0090648 A1 * | 4/2011 | Chen et al. | 361/707 |

OTHER PUBLICATIONS

Renesas Technology Corp., "Low Voltage Power MOSFET", Apr. 2007, No. DS-PP-07004B Rev. 2 (pp. 1-30).

* cited by examiner

*Primary Examiner* — Khiem Nguyen
(74) *Attorney, Agent, or Firm* — Dicke, Billig & Czaja, PLLC (57) ABSTRACT

One aspect is a circuit arrangement including a first semiconductor switching element, a second semiconductor switching element connected in series with the first semiconductor switching element and a freewheeling element connected in parallel with the second semiconductor switching element.

23 Claims, 7 Drawing Sheets

CIRCUIT ARRANGEMENT HAVING TWO SEMICONDUCTOR SWITCHING ELEMENTS AND ONE FREEWHEELING ELEMENT

BACKGROUND

Circuit arrangements including two semiconductor switching elements and one freewheeling element can be used for example for driving an inductive load, such as, for example, an electric motor or a solenoid valve. In such a case, a first one of the two switching elements serves for applying a supply voltage to the load, while a second one of the two switching elements together with the freewheeling element forms a freewheeling device that enables a freewheeling current through the load when the first semiconductor switching element is driven in the off state.

An inductive load driven by a circuit arrangement including two semiconductor switching elements and one freewheeling element can also be an inductive storage element in a switching converter. Switching converters serve for converting an input voltage, which can be applied to input terminals, into an output voltage, which can be tapped off at output terminals. There are switching converters which include an inductive storage element, a first semiconductor switching element, a second semiconductor switching element, and a freewheeling element connected in parallel with the second semiconductor switching element. In such switching converters, the first semiconductor switching element serves to apply the input voltage to the inductive storage element in clocked fashion, and the second semiconductor switching element serves to accept a freewheeling current of the inductive storage element during those time durations during which the first semiconductor switching element is turned off. In this case, the freewheeling element accepts the freewheeling current during those time durations during which the first and second semiconductor switching elements are simultaneously turned off.

Known semiconductor switching elements for switching converters are, for example, power transistors, such as, for example, power MOSFET or power IGBT. Known freewheeling elements are diodes, such as, for example, bipolar diodes or Schottky diodes. Such transistors and diodes are integrated in semiconductor bodies (dies) accommodated in a chip housing. During the operation of a switching converter, electrical losses arise in the semiconductor switching elements and the freewheeling element, and can lead to heating of the semiconductor body of the respective component. This heat must be dissipated from the respective chip housing since otherwise the component can be overheated and thereby destroyed.

For these and other reasons there is a need for the present invention.

SUMMARY

One aspect relates to a circuit arrangement including: a first semiconductor switching element; a second semiconductor switching element connected in series with the first semiconductor switching element; a freewheeling element connected in parallel with the second semiconductor switching element; a first chip housing, in which the first semiconductor switching element and the freewheeling element are arranged, wherein the second semiconductor switching element is arranged in a second chip housing or in the first chip housing at a distance from the first semiconductor switching element and the freewheeling element.

One aspect relates to a switching converter including: an inductive storage element; a first semiconductor switching element for controlling a taking up of current by the inductive storage element; a second semiconductor switching element connected in series with the first semiconductor switching element; a freewheeling element connected in parallel with the second semiconductor switching element; a first chip housing, in which the first semiconductor switching element and the freewheeling element are arranged, wherein the second semiconductor switching element is arranged in a second chip housing or in the first chip housing at a distance from the first semiconductor switching element and the freewheeling element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts. In this case, the main emphasis is on explaining the basic principle. Consequently, the figures only illustrate the parts and the signals necessary for understanding said basic principle.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
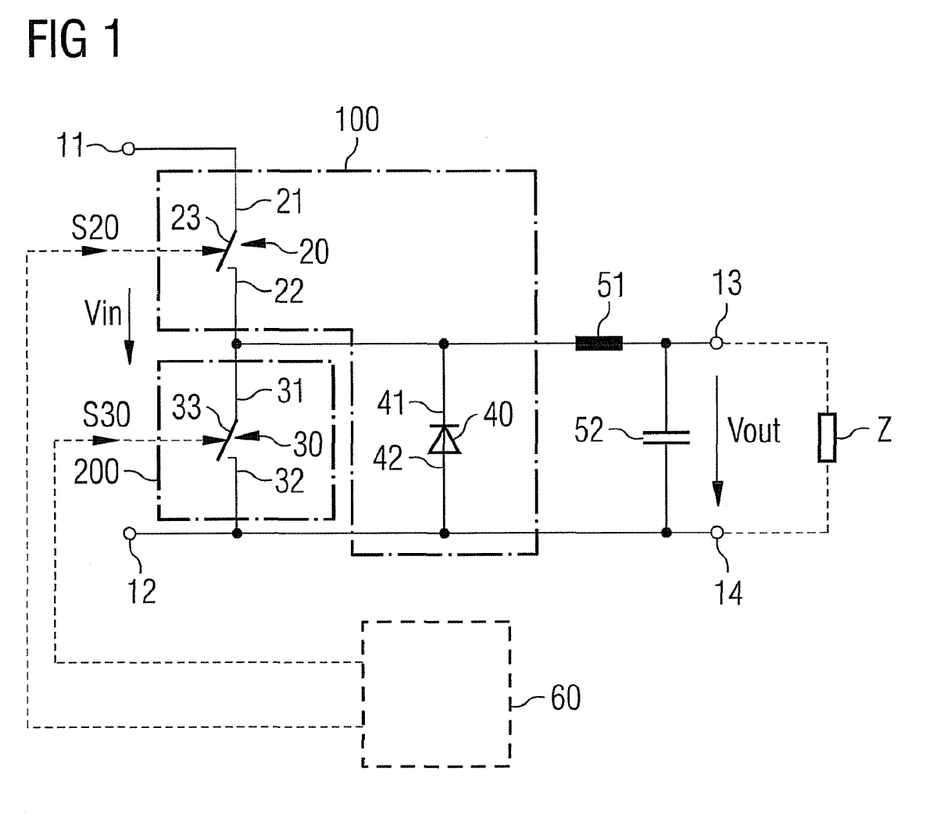
FIG. 1 illustrates a circuit arrangement including two semiconductor switching elements and one freewheeling element in a switching converter on the basis of an electrical equivalent circuit diagram of a first example of a switching converter.

FIG. 1 illustrates the electrical equivalent circuit diagram of an example of a switching converter. This switching converter has input terminals 11, 12 for applying an input voltage Vin and output terminals 13, 14 for providing an output voltage Vout. A load Z (represented by dashed lines) can be connected to the output terminals 13, 14, said load being supplied by the output voltage Vout.

The switching converter additionally has a circuit arrangement including a first and a second semiconductor switching element 20, 30, and including a freewheeling element 40 connected in parallel with the second semiconductor switching element 30.

The switching converter additionally includes an inductive storage element 51 and a capacitive storage element 52, which is realized for example as a capacitor and which is also referred to hereinafter as output capacitor 52. Said capacitive storage element 52 is connected between the output terminals 13, 14 of the switching converter, such that the output voltage Vout is present across said capacitive storage element 52. In this switching converter, the first semiconductor switching element 20 serves for connecting the inductive storage element 51—more precisely: the series circuit including the inductive storage element and the capacitive storage element—to the input terminals 11, 12 in clocked fashion in order thereby to feed electrical energy to the inductive storage element 51 by means of the input voltage Vin present between the input terminals 11, 12. The second semiconductor switching element 30 and the freewheeling element 40 serve to provide a freewheeling current path for the inductive storage element 51 when the first semiconductor switching element 20 is driven in the off state.

The switching converter illustrated in FIG. 1 is realized as a buck converter. In this case, the first semiconductor switching element 20, the inductive storage element 51 and the capacitive storage element 52 are connected in series with one another between the input terminals 11, 12. It should be noted in this context that one 12 of the input terminals 11, 12 and one 14 of the output terminals 13, 14 are at a common electrical potential, such as, for example, a reference potential, such as ground. The second semiconductor switching element 30 and the rectifier element 40 are connected in parallel with a series circuit including the inductive storage element 51 and the capacitive storage element 52.

The two semiconductor switching elements 20, 30 respectively have a first 21, 31 and second 22, 32 load path connection and a control connection 23, 33. A load path of the respective switching element 20 and 30 runs between the load path connections 21, 31 and 22, 32, respectively. The rectifier element 40 has a first and a second load path connection 41, 42, between which a load path is likewise formed. The load paths of the second semiconductor switching element 30 and of the rectifier element 40 are connected in parallel with one another in this case. The load path of the first semiconductor switching element 20 is connected in series with the inductive storage element 51 and the capacitive storage element 52.

The first and second semiconductor switching elements 20, 30 are driven in the on state and in the off state in clocked fashion, to be precise in such a way that the two semiconductor switching elements 20, 30 are not turned on simultaneously. The two semiconductor switching elements 20, 30 can be driven in the on state and in the off state according to drive signals S20, S30, which are fed to the control connections 23, 33 of the semiconductor switching elements 20, 30. Said drive signals S20, S30 can be generated, in a manner known in principle, by a drive circuit 60 (represented by dashed lines) depending on the output voltage Vout.

The drive signals S20, S30 are generated for example with the aim of regulating the output voltage Vout to a constant value at least approximately independently of a power consumption of the load Z. This regulation is effected for example by means of the duty cycle of the first drive signal S20. In this case, the duty cycle is defined for a drive period by the ratio of switched-on duration to switched-off duration. In this case, the switched-on duration is the duration during which the first semiconductor switching element 20 is driven in the on state during a drive period. In this case, a drive period lasts for example from an instant at which the first semiconductor switching element 20 is driven in the on state to a later instant at which the first semiconductor switching element 20 is driven anew. The second semiconductor switching element 30 is likewise driven in the on state for a switched-on duration during a drive period, to be precise such that the switched-on duration of the first semiconductor switching element 20 and the switched-on duration of the second semiconductor switching element 30 (which can last for different lengths of time) do not overlap temporarily.

If the first semiconductor switching element 20 is driven in the on state, then the input voltage Vin is present across the series circuit including the first semiconductor switching element 20, the inductive storage element 51 and the capacitive storage element 52. In this case, there is present across the inductive storage element 51 a voltage corresponding approximately to a difference between the input voltage Vin and the output voltage Vout, which is smaller than the input voltage Vin, if a voltage drop across the first semiconductor switching element 20 is disregarded. A current through the inductive storage element 51, which is a storage inductor, for example, rises as a result, to be precise depending on the difference between the input voltage Vin and the output voltage Vout.

The inductive storage element 51 takes up electrical energy during this switched-on duration and is thereby magnetized. If the first semiconductor switching element 20 is subsequently turned off, then the inductive storage element 51 is demagnetized. A current I51 that flows in the process, which current flows in the same direction through the inductive storage element as previously during the switched-on duration of the first semiconductor switching element 20, is in this case accepted by the parallel circuit including the rectifier element 40 and the second semiconductor switching element 30. The rectifier element 40 accepts said current I51 during those time durations during which the second semiconductor switching element 30 is not yet turned on after the first semiconductor switching element 20 has been driven in the off state, or is no longer turned on prior to the first semiconductor switching element 20 being driven in the on state again.

A time delay between the instant at which the first semiconductor switching element 20 is driven in the off state and the second switching element 30 is driven in the on state, or between the second semiconductor switching element 30 being driven in the off state and the first semiconductor switching element 20 being driven in the on state again, is expedient in this case in order to avoid a short circuit between the input terminals 11, 12.

The rectifier element 40 is designed to conduct an electric current if a voltage having a first polarity is present across its load path, and is designed to block an electric current if a voltage having a second polarity is present across its load path. Said rectifier element is connected up in such a way that it is turned off if the first semiconductor switching element 20 is turned on, that is to say when the input voltage Vin is present between the first and second load path connections 41, 42 of the rectifier element 40.

The rectifier element 40 is for example a diode, such as, for example, a bipolar diode or a Schottky diode, the cathode connection of which forms the first load path connection 41 and the anode connection of which forms the second load path connection 42 and the cathode connection 41 of which is connected to a circuit node common to the first semiconductor switching element 20 and to the inductive storage element 51.

Figure 2A:
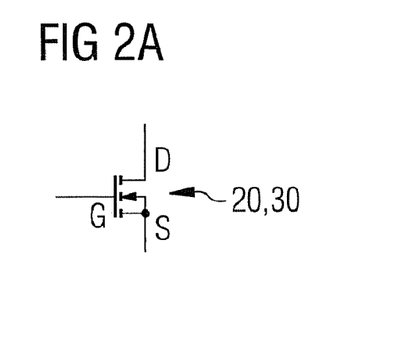
FIG. 2 illustrates the use of a MOSFET or IGBT as semiconductor switching element.
Figure 2B:
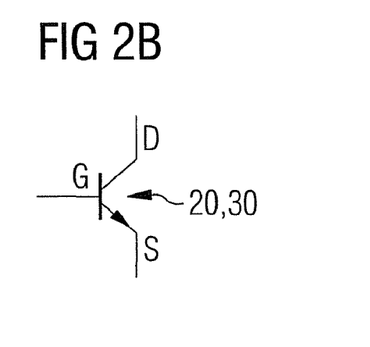

In the circuit explained and in all the circuits that will be explained below, the semiconductor switching elements 20, 30 are for example power MOSFETs or power IGBTs. Electrical equivalent circuit diagrams of such a power MOSFET and of such a power IGBT are illustrated in FIGS. 2A and 2B. These components each have a gate connection, which forms a control connection, and also drain and source connections D, S, which form load path connections. Such power MOSFETs or power IGBTs are known in principle and can have different dielectric strengths depending on the respective embodiment. Said dielectric strengths can be from a few 10V up to a few 100V. In this case, the "dielectric strength" represents a voltage across the load path of the component which the component withstands in the driven-off state without being destroyed.

Power MOSFETs and power IGBTs are available as n-conducting and p-conducting types. The circuit symbols illustrated in FIGS. 2A and 2B in this case represent n-conducting types. When using n-conducting MOSFETs or n-conducting IGBTs as semiconductor switching elements 20, 30, these should be connected up, referring to FIG. 1, in such a way that the drain connections form the first load path connections 21, 31 and the source connections form the second load path connections 22, 32. P-conducting types should correspondingly be connected up oppositely.

The semiconductor switching elements 20, 30 unavoidably have on resistances. This term denotes ohmic resistances which the load paths of the semiconductor switching elements 20, 30 have when the semiconductor switching elements 20, 30 are driven in the on state. Owing to these on resistances, ohmic losses occur in the semiconductor switching elements 20, 30 during operation of the switching converter, said losses being converted into heat.

Losses additionally arise during the switch-on and switch-off phases, that is, when the semiconductor switching elements undergo transition from the on state to the off state, or from the off state to the on state. If semiconductor switching elements 20, having identical on resistances are used, then, in the case of a buck converter, the electrical energy converted into heat in the second semiconductor switching element 30 during a drive period is greater than the electrical energy converted into heat in the first semiconductor switching element 20 during a drive period. For the ratio between the input voltage Vin and the output voltage Vout is approximately dependent on a ratio between a switched-on duration Ton2 of the second semiconductor switching element 30 and a switched-on duration Ton1 of the first semiconductor switching element 20. The following therefore holds true:

$$Ton2/Ton1 = Vin/Vout \tag{1}$$

If it is taken into consideration that the input voltage Vin is greater than the output voltage Vout in a buck converter, then the second semiconductor switching element 30 is switched on for longer than the first semiconductor switching element 10 during a drive period, such that the electrical energy converted into heat on average in the second semiconductor switching element 30 is greater than the energy converted into heat in the first semiconductor switching element 20, assuming that an average value of the current I52 which flows through the first semiconductor switching element 20 during the first switched-on duration Ton1 corresponds to the average value of the current I52 which flows through the second semiconductor switching element 30 during the second switched-on duration Ton2.

The semiconductor switching elements 20, 30 and the rectifier element 40 are semiconductor components, which can in principle be integrated in one or in a plurality of semiconductor bodies. Said semiconductor bodies are permitted to heat up only to a predetermined maximum temperature, since otherwise there is the risk of destruction of the semiconductor component integrated in the respective semiconductor body. In this case, the risk of overheating of a semiconductor body is all the higher, the more semiconductor components in which heat loss arises simultaneously are arranged spatially closely adjacent to one another.

In order to avoid overheating of the first semiconductor switching element 20 and of the rectifier element 40 by the second semiconductor switching element 30 in the case of a switching converter in accordance with FIG. 1, provision is made in one example for arranging the semiconductor body or semiconductor bodies with the first semiconductor switching element 20 and the rectifier element 40 in a first chip housing 100, and arranging a semiconductor body with the second semiconductor switching element 30 in a second chip housing 200. Dash-dotted lines in FIG. 1, which are arranged around the first semiconductor switching element 20 and the rectifier element 40, on the one hand, and around the second semiconductor switching element 30, on the other hand, and which are designated by 100 and 200, symbolize the chip housings in the electrical equivalent circuit diagram.

Figure 3A:
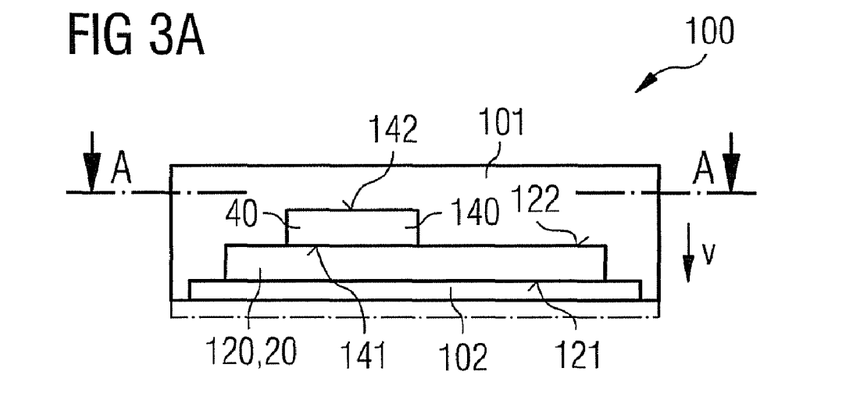
FIG. 3 illustrates a first example of an arrangement of the first semiconductor switching element and of the freewheeling element in a common chip housing.
Figure 3B:
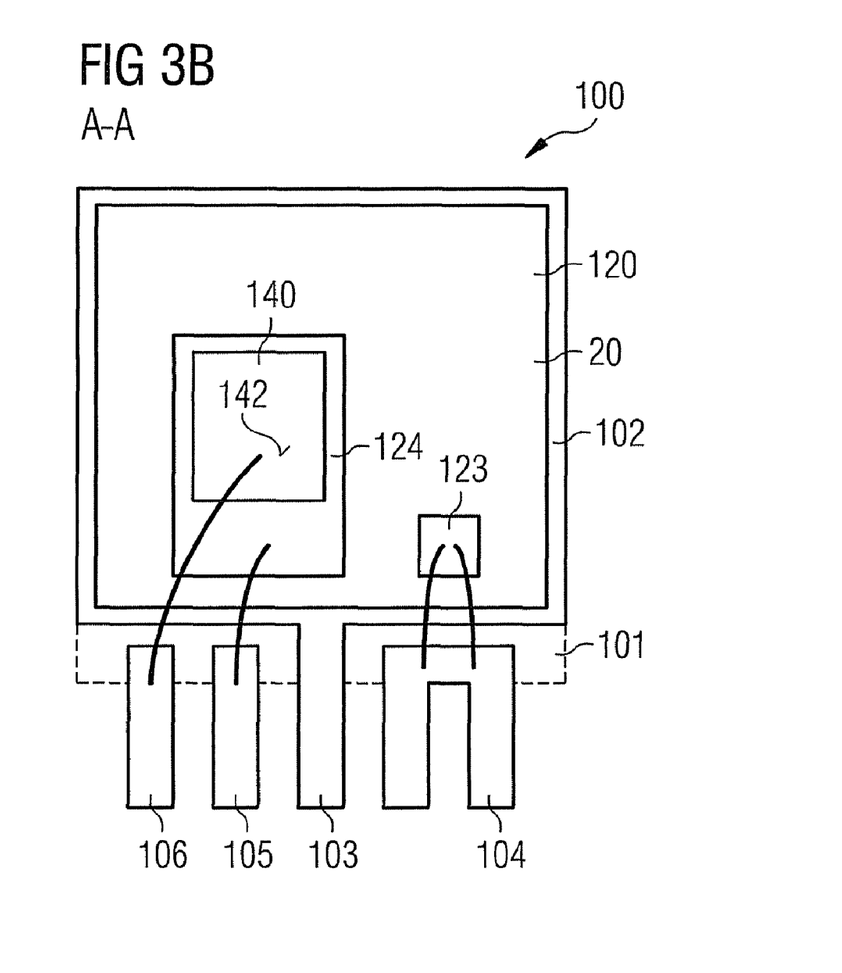

One possible example of an arrangement of the first semiconductor switching element 20 and of the rectifier element 40 in a first chip housing 100 is explained below with reference to FIGS. 3A and 3B, which illustrate cross sections through the chip housing 100. In the example illustrated, the first semiconductor switching element 20 is integrated in a first semiconductor body 120, and the rectifier element 40 is integrated in a second semiconductor body 140. The semiconductor bodies 120, 140 can be composed for example of an identical semiconductor material, such as, for example, silicon (Si) or silicon carbide (SiC). Furthermore, there is the possibility of realizing the first semiconductor switching element 20 and the rectifier element 40 in semiconductor bodies composed of different semiconductor materials. Thus, by way of example, the semiconductor body 120 of the first semiconductor switching element 20 can be composed of silicon, while the semiconductor body 140 of the rectifier element 40 can be composed of silicon carbide, or vice versa.

In the example illustrated, the semiconductor body 120 of the switching element and the semiconductor body 140 of the rectifier element are arranged one above another using chipon-chip technology. In this case, the rectifier element 40 is a vertical rectifier element having a first load path connection, which is formed by a first surface 141 of the semiconductor body 140, and having a second load path connection, which is formed by a second surface 142 of the semiconductor body 140. In the example illustrated, the first semiconductor switching element 20 is likewise a vertical component having a first load path connection, which is formed by a first surface 121 of the semiconductor body 120. A load connection pad 124 for a second load path connection and also a connection pad 123 for a control connection are formed on a second surface 122 of said semiconductor body 120. In the example illustrated, an electrical contact between the first load path connection 41 of the rectifier element 40 and the second load path connection 22 of the first semiconductor switching element 20 is produced by the first surface 141 of the semiconductor body 140 of the rectifier element being applied to the connection pad 124 for the second load path connection of the first semiconductor switching element 20 and being electrically conductively connected to said pad. For this purpose, the semiconductor body 140 of the rectifier element is for example soldered onto the connection pad 124 or adhesively bonded onto said pad by means of an electrically conductive adhesive.

In the example illustrated, the chip housing 100 has a leadframe and a plastics composition or molding composition 101. The semiconductor body 120 of the first semiconductor switching element 20 is applied by its first side 121 to the leadframe 102 and electrically conductively connected thereto. For this purpose, the semiconductor body 120 is for example soldered onto the leadframe 102 or adhesively bonded onto said leadframe by means of an electrically conductive adhesive. Contact can be made with the first load path connection 21—formed by the first side 121 of the semiconductor body 120—of the first semiconductor switching element 20 by means of a first connection pin 103 of the leadframe 102, said connection pin projecting from the plastics composition 101. It should be noted in this context that the leadframe 102—as illustrated—can be completely uncovered on a side opposite to the semiconductor body 120, that is to say does not have to be covered by the plastics composition 101. In this case, that side of the leadframe 102 which is remote from the semiconductor body 120 can serve directly as a connection contact for the first load path connection of the semiconductor switching element 20. The first connection pin 103 can be dispensed with, if appropriate, in this case. Furthermore, there is also the possibility of the plastics composition 101 completely surrounding the leadframe 102, as is illustrated by dash-dotted lines in FIG. 3A, and of only the first connection pin 103 projecting from the plastics composition 101.

The chip housing 100 illustrated in the example has further connection pins: a first further connection pin 104, which is connected to the control connection pad 123 by at least one bonding wire; a second further connection pin 105, which is connected to the connection pad 124 for the second load path connection 22; and a third further connection pin 106, which is connected to the second load path connection 42 of the rectifier element 40, said second load path connection being formed by the second surface 142. These connection pins 104-106 project from the plastics composition 101 and are electrically insulated from one another. These connection pins 104-106 can be realized, for example, as connection clips having two or more pins projecting from the plastics composition 101, as is illustrated for the first further connection pin 104 in FIG. 3B. This connection pin has a contact region, for one or for a plurality of bonding wires, and a plurality of pins directly adjacent to the contact region. As is illustrated for this connection pin in FIG. 3B, contact can be made with a connection pin within the housing by a plurality of bonding wires, whereby the current-carrying capacity can be increased. Instead of the connection clip 104 having a plurality of pins, a plurality of individual connection pins (not illustrated) could also be used which are connected to a common contact area 123 within the housing 100. Said plurality of connection pins can additionally be connected to one another by means of bonding wires in the housing.

For better dissipation of heat loss from the chip housing 100, the chip housing 100 can be arranged on a heat sink (not illustrated). Good heat dissipation can be achieved by the leadframe 102 being realized in such a way that it is uncovered on the side opposite to the semiconductor body 120 and is applied to the heat sink at said side. In this case, the further connection pins 104-106 are realized in such a way that they are arranged in a manner offset in a vertical direction with respect to a plate-type section of the leadframe 102 to which the semiconductor body 120 is applied. This prevents the further connection pins 104-106 from being electrically short-circuited with one another by the heat sink. In this context, a vertical direction is a direction running perpendicular to the plane of the drawing in accordance with FIG. 3*b*, or a direction designated by v in FIG. 3*a*.

Figure 4A:
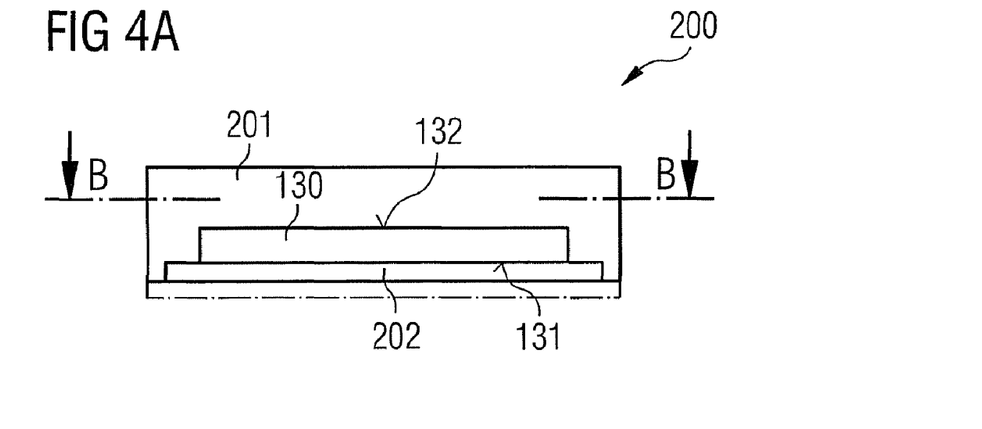
FIG. 4 illustrates an example of an arrangement of the second semiconductor switching element in a second chip housing.
Figure 4B:
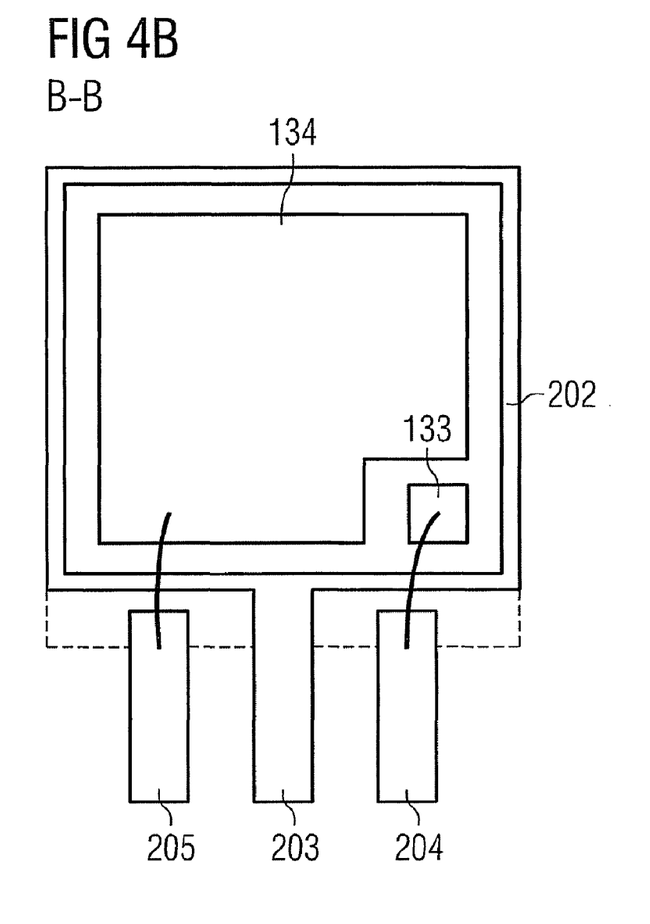

FIGS. 4A and 4B illustrate cross sections through an example of a second chip housing 200, in which the second semiconductor switching element 30 is integrated, in different sectional planes. The chip housing 200 likewise has a leadframe 202 and a plastics composition 201. The second semiconductor switching element 30 is integrated in a further semiconductor body 130 and is for example likewise a vertical semiconductor switching element. In this case, a first load path connection 31 of the second semiconductor switching element 30 is formed by a first surface 131 of the further semiconductor body 130. In this case, a second load path connection and a control connection are formed by a load connection pad 134 and a control connection pad 133, which are arranged in the region of a second surface 132 of the semiconductor body 130. The leadframe 202 of the second chip housing 200 can be realized in a manner corresponding to the leadframe 102 of the first chip housing 100, that is to say in such a way that it is either uncovered on a side opposite to the semiconductor body 130 or is surrounded by a plastics composition 201 in the region of said side. Contact can be made with the load path connection formed by the first surface 131 by means of a first connection pin 203 of the leadframe 202, which projects from the plastic housing 201. Contact can be made with the control connection and the second load path connection by means of a second and third connection pin 204, 205, which are connected to the control connection pad 133 and to the load path connection pad 134, respectively, by means of bonding wires.

The first and second chip housings 100, 200 can be arranged on a common printed circuit board (not illustrated). In this case, the first components arranged in the chip housings 100, 200 are connected up to one another and to the inductive and the capacitive storage element 51, 52 in accordance with the equivalent circuit diagram in FIG. 1 via conductor tracks on the printed circuit board and the connection pins. On account of the spatial separation—ensured by the two chip housings 100, 200—between the first semiconductor switching element 20 and the rectifier element 40, on the one hand, and the second semiconductor switching element 30, on the other hand, mutual overheating of the two semiconductor switching elements 20, 30 can be avoided. With regard to the first semiconductor switching element 20 and the rectifier element 40, which are arranged in a common chip housing 100, there is no such risk of overheating since these two components are never turned on simultaneously, as has already been explained comprehensively above. By contrast, the average power consumption of the second semiconductor switching element 30 is greater than that of the rectifier element 40, such that there would be such a risk of overheating if the first semiconductor switching element 20 and the rectifier element 40 were arranged jointly in a common housing.

Figure 5A:
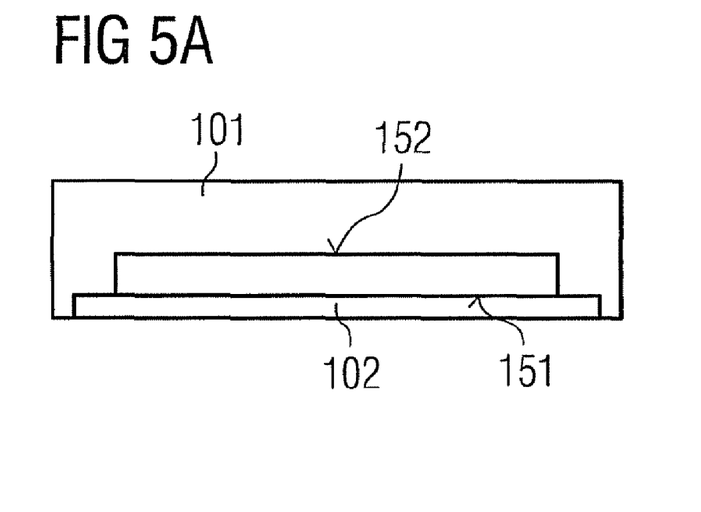
FIG. 5 illustrates a second example of an arrangement of the semiconductor switching element and of the freewheeling element in a common chip housing.
Figure 5B:
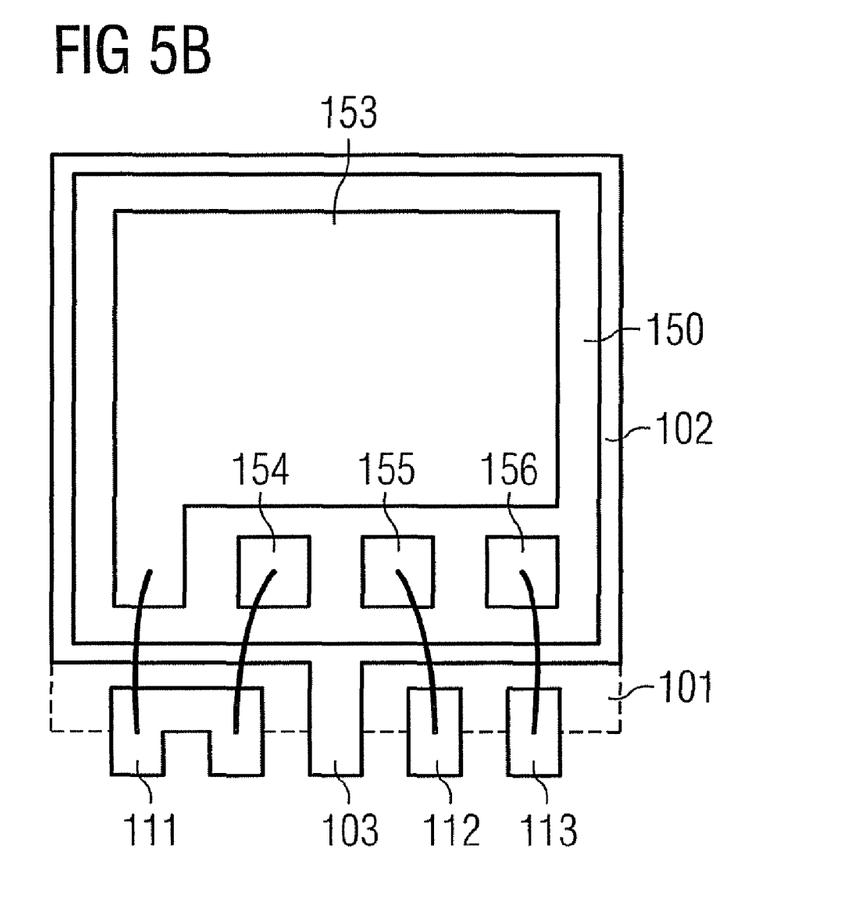

Instead of integrating the first semiconductor switching element 20 and the rectifier element 40 in separate semiconductor bodies 120, 140 there is also the possibility of integrating these components in a common semiconductor body 150, which is illustrated with reference to FIGS. 5A and 5B. These figures illustrate cross sections through the first chip housing 100 in different sectional planes. The common semiconductor body 150 has a first surface 151 and a second surface 152. The first surface 151 forms for example a first load path connection of the first semiconductor switching element 20. A plurality of connection pads are present in the region of a second surface 152 opposite the first surface 151: a first connection pad 153 for the second load path connection 22 of the first semiconductor switching element 20; a second connection pad 154 for the first load path connection 41 of the rectifier element 40; a third connection pad 155 for the second load path connection 42 of the rectifier element 40; and a fourth connection pad 156 for the control connection 23 of the first semiconductor switching element 20. These connection pads are connected to connection pins 111, 112, 113 by means of bonding wires. In this case, the first and second connection pads 153, 154 are connected to a common connection pin, which, referring to FIG. 1, represents the circuit node which is common to the first semiconductor switching element 20 and the rectifier element 40 and to which the inductive storage element 51 can be connected.

Figure 6:
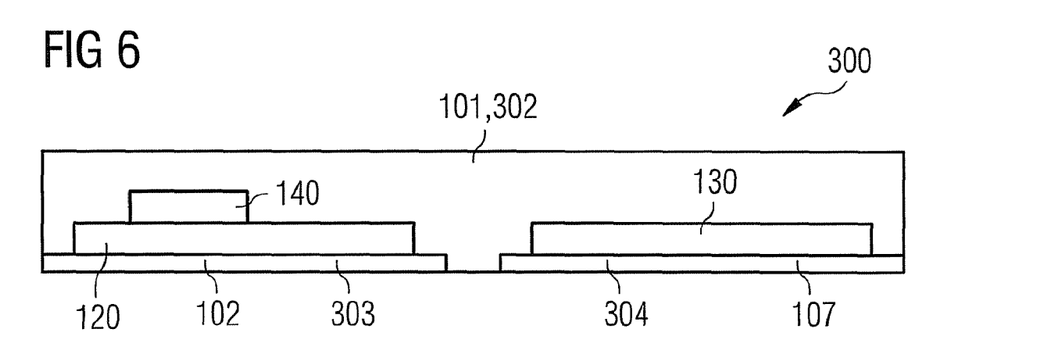
FIG. 6 illustrates an example of an arrangement of the first semiconductor switching element and of the freewheeling element and of the second semiconductor switching element in a common chip housing.

Instead of arranging the first semiconductor switching element 20 and the rectifier element 40, on the one hand, and the second semiconductor switching element 30, on the other hand, in separate chip housings 100, 200, there is also the possibility, referring to FIG. 6, of arranging the semiconductor switching elements in a common chip housing, but at the same time of arranging the second semiconductor switching element 30 integrated in the further semiconductor body 130 in a manner spatially at a distance from the semiconductor bodies 120, 140 with the first semiconductor switching element 20 and the rectifier element 140. The chip housing 300 can have for example two leadframes 303, 304 arranged at a distance from one another, wherein the semiconductor bodies 120, 140 with the first semiconductor switching element 20 and the rectifier element 40 can be arranged on the first leadframe 303 and the semiconductor body 130 with the second semiconductor switching element 30 can be arranged on the second leadframe 304. As is illustrated in FIG. 6, the first semiconductor switching element 20 and the rectifier element 40 can be realized using chip-on-chip technology. Furthermore, there is also the possibility of monolithically integrating these components in a single semiconductor body, as was explained with reference to FIG. 5. Contact can be made with the semiconductor components arranged in the chip housing 300 by means of connection pins in the same way as in the case explained with reference to FIGS. 3 and 4, wherein said semiconductor components are realized in different chip housings. The difference merely consists in the fact that the connection pins explained with reference to FIGS. 3 and 4 then project from a single chip housing.

It goes without saying that the partitioning explained above, in which a first semiconductor switching element 20 and a rectifier element 40, on the one hand, and a second semiconductor switching element 30, on the other hand, are arranged in separate chip housings or are arranged in a manner spatially at a distance from one another in a common chip housing, is not restricted to the buck converter explained with reference to FIG. 1, but rather can be applied to any desired switching converters including two semiconductor switching elements and a rectifier element connected in parallel with a semiconductor switching element.

Figure 7:
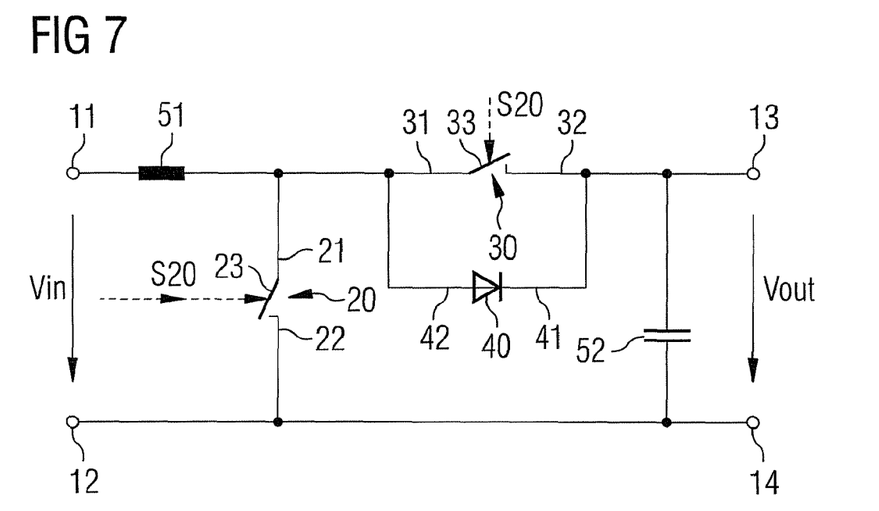
FIG. 7 illustrates a second example of a switching converter on the basis of an electrical equivalent circuit diagram.

FIG. 7 illustrates, on the basis of an electrical equivalent circuit diagram, a switching converter formed as a boost converter and including a first and a second semiconductor switching element 20, 30, a rectifier element 40 connected in parallel with the second semiconductor switching element 30, and also an inductive and a capacitive storage element 51, 52. In the case of such a boost converter, the input voltage Vin is less than the output voltage Vout. As in the case of the buck converter in accordance with FIG. 1, the first semiconductor switching element 20 serves for controlling a taking up of current by the inductive storage element 51 and, for this purpose, is connected in series with the inductive storage element 51 between the input terminals 11, 12. A series circuit including the second semiconductor switching element 30 and the capacitive storage element 52 is connected in parallel with the first semiconductor switching element 20. The rectifier element 40 is connected with polarity such that it permits a current flow from the inductive storage element 51 to the capacitive storage element 52, but prevents such a current flow in the opposite direction.

Figure 8A:
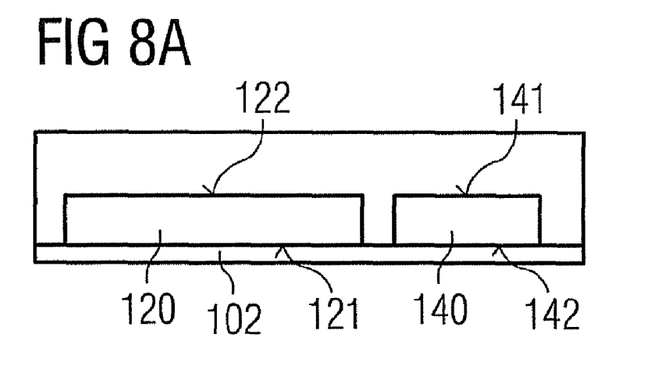
FIG. 8 illustrates a further example of an arrangement of a first semiconductor switching element and of a freewheeling element of a switching converter in a common chip housing.
Figure 8B:
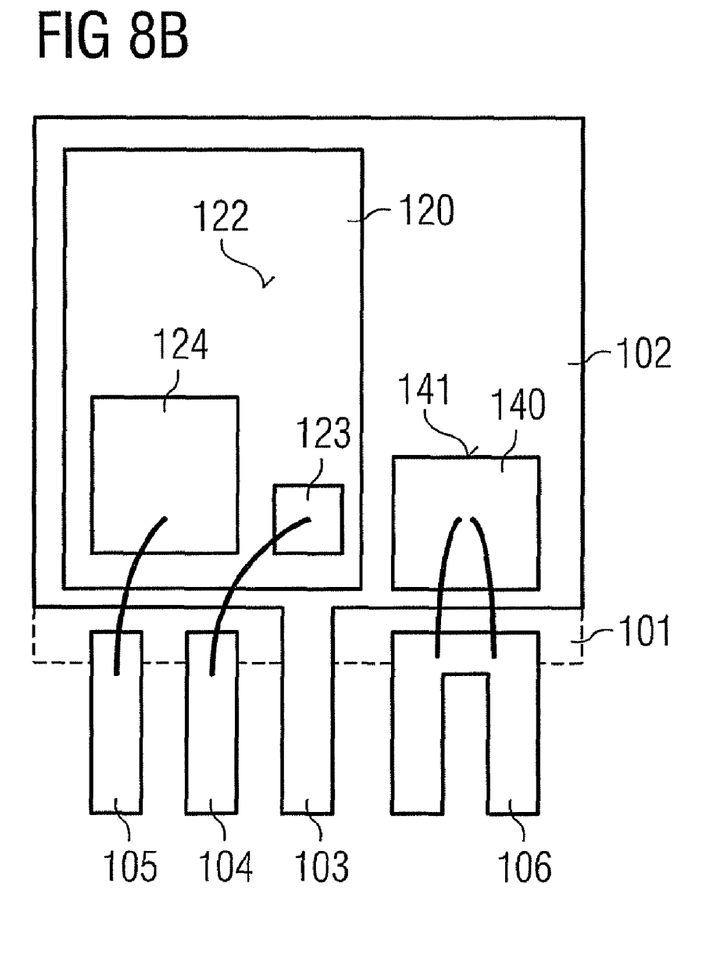

FIG. 8 illustrates an example of the arrangement of the first semiconductor switching element 120 and the rectifier element 40 for the boost converter in accordance with FIG. 7 in a common chip housing 100. In the example illustrated, the two components are realized in separate semiconductor chips 120, 140 and are realized as vertical components, wherein a first surface 121 of the semiconductor body 120 forms a first load path connection of the first semiconductor switching element 20, and wherein a first connection pad 123 for a control connection and a second connection pad 124 for a second load path connection of the first semiconductor switching element 20 are provided in the region of a second surface 122. A first load path connection 41 of the rectifier element is formed by a first surface 141 of the semiconductor body 140, and a second load path connection 42 of the rectifier element 40 is formed by a second surface 142 of the semiconductor body 140. In the example illustrated, the semiconductor bodies with the first semiconductor switching element 20 and the rectifier element 40 are arranged on a common leadframe 102 using chip-by-chip technology. In this case, the first surface 121 of the semiconductor body 120 and the second surface 142 of the semiconductor body 140 make contact with the leadframe 102, whereby the first load path connection 21 of the first semiconductor switching element 20 and the second load path connection 42 of the rectifier element 40 are electrically conductively connected to one another. In this case, the leadframe 102 represents the circuit node which is illustrated in FIG. 7 and which is common to the first semiconductor switching element 20 and the rectifier element 40 and which serves for the connection of the inductive storage element 51. In a manner already explained in principle, the leadframe 102 can have a connection pin 103, which projects from the plastics composition 101 and via which contact can be made with said common circuit node. The first and second connection pads 123, 124 of the semiconductor body 120 are connected via bonding wires to further connection pins 104, 105, via which contact can be made with the control connection and the second load path connection of the first semiconductor switching element 20 externally, that is to say from outside the housing. The chip housing illustrated in FIG. 8 has a further connection pin 106, which is connected via a bonding wire to the first surface 141 of the semiconductor body 140 opposite to the leadframe 102. Said first surface 141 forms the first load path connection of the rectifier element 41 in the manner explained.

Figure 9:
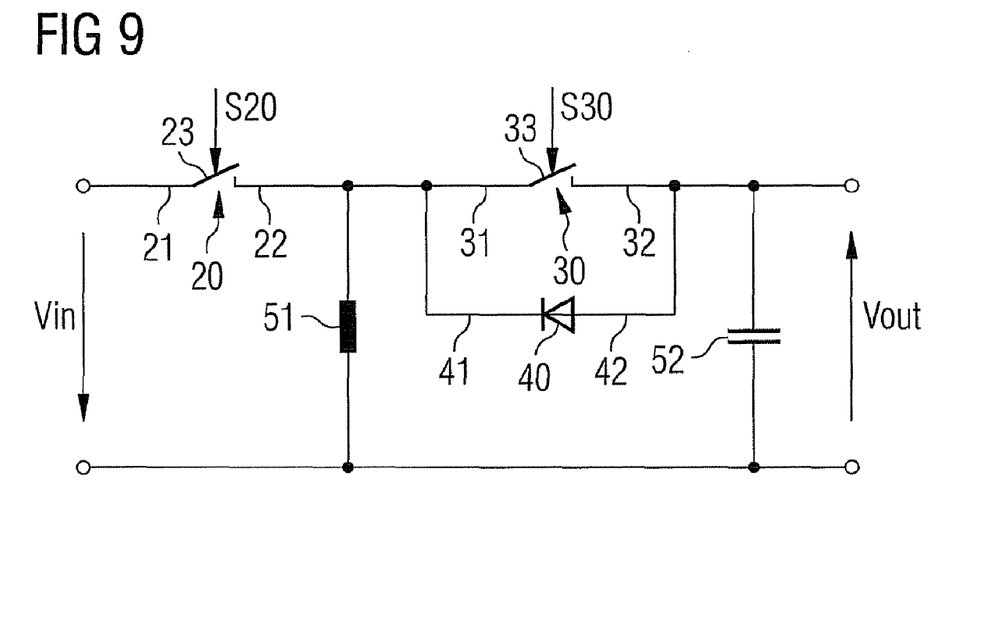
FIG. 9 illustrates a third example of a switching converter on the basis of an electrical equivalent circuit diagram.

The partitioning concept explained can furthermore also be applied to a buck-boost converter. The electrical equivalent circuit diagram of such a buck-boost converter is illustrated in FIG. 9. In this buck-boost converter, the first semiconductor switching element 20 is connected in series with the inductive storage element 51 between the input terminals 11, 12. A series circuit including the capacitive storage element 20 and the second semiconductor switching element 30, with which the rectifier element 40 is connected in parallel, is in this case connected in parallel with the inductive storage element 51. In this case, the rectifier element 40 is connected with polarity such that it is turned off if the first semiconductor switching element 20 is driven in the on state.

To supplement the explanation above it should be noted that a drive circuit that generates drive signals S20, S30 for the semiconductor switching elements 20, 30 can be integrated in the first or second chip housing 100, 200, to be precise for example using chip-on-chip technology, using chip-by-chip technology or by monolithic integration of said drive circuit in the semiconductor body of the first or second semiconductor switching element 20, 30 or of the rectifier element 40. If the drive circuit is integrated together with a semiconductor switching element in a common chip housing, then it is possible to dispense with leading the control connection of said semiconductor switching element out from the chip housing, that is, providing a connection pin for said control connection. In this case, the drive circuit can directly make contact with the control connection of the respective semiconductor switching element within the chip housing.

Furthermore, in a manner not illustrated more specifically, there is the possibility of integrating at least one of the inductive and capacitive storage elements in one of the chip housings explained.

The figures explained above illustrate the use of a circuit arrangement including a first and a second semiconductor switching element and a freewheeling element connected in parallel with the second semiconductor switching element, which is also referred to hereinafter as switching element arrangement, for various switching converters. In such switching converters, the first semiconductor switching element serves for controlling a current through the inductive storage element, while the second semiconductor switching element and the freewheeling element connected in parallel form a freewheeling device which enables a freewheeling current through the inductive load when the first semiconductor switching element is driven in the off state.

A circuit arrangement including a first and a second semiconductor switching element and a freewheeling element connected in parallel with the second semiconductor switching element can be employed not just in switching converters, however, but rather can be used for controlling any desired inductive loads, such as, for example, electric motors or solenoid valves, as is explained below with reference to FIGS. 10 and 11. These figures in each case illustrate electrical equivalent circuit diagrams on the basis of which the interconnection of the load with the circuit arrangement including the semiconductor switching elements and the freewheeling element becomes clear. It should be pointed out in this context that all explanations given above concerning the partitioning, that is to say concerning the integration of the first and second semiconductor switching elements and of the freewheeling element in chip housings, likewise apply to the examples explained below.

Figure 10:
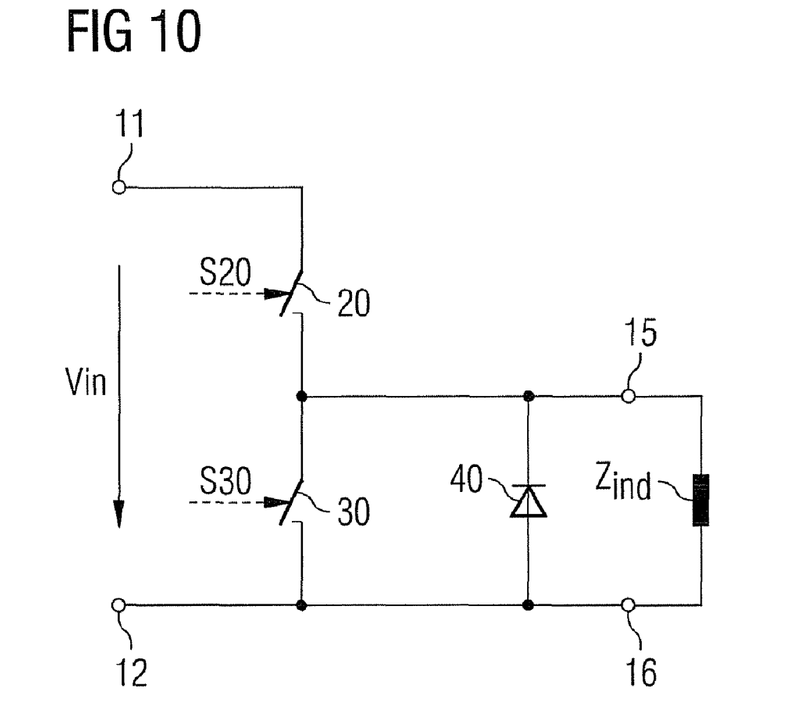
FIG. 10 illustrates the use of a circuit arrangement including two semiconductor switching elements and one freewheeling element for driving an inductive load on the basis of an electrical equivalent circuit diagram.

In the example illustrated in FIG. 10, the switching element arrangement 20, 30, 40 serves for driving an inductive load $z_{ind}$, which is connected between connection terminals 15, 16 in parallel with the second semiconductor switching element 30 and the freewheeling element 40. In this circuit, the two switching elements 20, 30 are driven in the on state and in the off state complementarily with respect to one another; when the first switching element 20 is driven in the on state, the input voltage Vin available between the input terminals 11, 12 is present across the load. If the inductive load is a motor, for example, then the rotational speed of the motor can be established by means of the duty cycle with which the first switching element is driven in the on state and in the off state.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising:
   a first semiconductor switching element;
   a second semiconductor switching element connected in series with the first semiconductor switching element;
   a freewheeling element connected in parallel with the second semiconductor switching element;
   a first chip housing, in which the first semiconductor switching element and the freewheeling element are arranged, wherein the second semiconductor switching element is arranged in one of a second chip housing and the first chip housing at a distance from the first semiconductor switching element and the freewheeling element.

2. The circuit arrangement as claimed in claim 1, wherein at least one of the first and second semiconductor switching elements is a MOS transistor.

3. The circuit arrangement as claimed in claim 1, wherein the first semiconductor switching element is integrated in a first semiconductor body, and wherein the freewheeling element is integrated in a second semiconductor body.

4. The circuit arrangement as claimed in claim 3, wherein the second semiconductor body is arranged on the first semiconductor body in the first chip housing.

5. The circuit arrangement as claimed in claim 3, wherein the second semiconductor body is arranged alongside the first semiconductor body in the first chip housing.

6. The circuit arrangement as claimed in claim 3, wherein the first and second semiconductor bodies are composed of an identical semiconductor material.

7. The circuit arrangement as claimed in claim 6, wherein the semiconductor material is silicon or silicon carbide.

8. The circuit arrangement as claimed in claim 3, wherein the first and second semiconductor bodies are composed of different semiconductor materials.

9. The circuit arrangement as claimed in claim 8,
   wherein a semiconductor material of the first semiconductor body comprises one of a group comprising silicon and silicon carbide, and
   wherein a semiconductor material of the second semiconductor body comprises one of the group comprising silicon or silicon carbide.

10. The circuit arrangement as claimed in claim 1, wherein the first semiconductor switching element and the freewheeling element are integrated in a common semiconductor body arranged in the first chip housing.

11. A switching converter comprising:
an inductive storage element;
a first semiconductor switching element for controlling a taking up of current by the inductive storage element;
a second semiconductor switching element connected in series with the first semiconductor switching element;
a freewheeling element connected in parallel with the second semiconductor switching element;
a first chip housing, in which the first semiconductor switching element and the freewheeling element are arranged, wherein the second semiconductor switching element is arranged in one of a second chip housing and the first chip housing at a distance from the first semiconductor switching element and the freewheeling element.

12. The switching converter as claimed in claim 1, wherein at least one of the first and second semiconductor switching elements is a MOS transistor.

13. The switching converter as claimed in claim 11, wherein the first semiconductor switching element is integrated in a first semiconductor body, and wherein the freewheeling element is integrated in a second semiconductor body.

14. The switching converter as claimed in claim 13, wherein the second semiconductor body is arranged on the first semiconductor body in the first chip housing.

15. The switching converter as claimed in claim 13, wherein the second semiconductor body is arranged alongside the first semiconductor body in the first chip housing.

16. The switching converter as claimed in claim 13, wherein the first and second semiconductor bodies are composed of an identical semiconductor material.

17. The switching converter as claimed in claim 16, wherein the semiconductor material is silicon or silicon carbide.

18. The switching converter as claimed in claim 13, wherein the first and second semiconductor bodies are composed of different semiconductor materials.

19. The switching converter as claimed in claim 18,
wherein a semiconductor material of the first semiconductor body comprises one of the group comprising silicon or silicon carbide, and
wherein a semiconductor material of the second semiconductor body comprises one of the group comprising silicon or silicon carbide.

20. The switching converter as claimed in claim 11, wherein the first semiconductor switching element and the freewheeling element are integrated in a common semiconductor body arranged in the first chip housing.

21. The switching converter as claimed in claim 11, configured as one of a buck converter and a boost converter.

22. A semiconductor device comprising:
a first semiconductor switching element;
a second semiconductor switching element connected in series with the first semiconductor switching element;
a freewheeling element connected in parallel with the second semiconductor switching element;
means in which the first and second semiconductor switching element and the freewheeling element are arranged for preventing the semiconductor elements from heating up above a predetermined maximum temperature.

23. The semiconductor device of claim 22 further comprising:
a first chip housing, in which the first semiconductor switching element and the freewheeling element are arranged;
wherein the second semiconductor switching element is arranged at a distance from the first semiconductor switching element and the freewheeling element in one of a second chip housing and the first chip housing.

* * * * *